(12) United States Patent
Razeghi

(10) Patent No.: US 7,692,183 B2
(45) Date of Patent: Apr. 6, 2010

(54) POLARITY INVERSION OF TYPE-II INAS/GASB SUPERLATTICE PHOTODIODES

(75) Inventor: Manijeh Razeghi, Wilmette, IL (US)

(73) Assignee: MP Technologies, LLC, Wilmette, IL (US)

( * ) Notice: Subject to any disclaimer, the term of this patent is extended or adjusted under 35 U.S.C. 154(b) by 46 days.

(21) Appl. No.: 12/044,091

(22) Filed: Mar. 7, 2008

(65) Prior Publication Data
US 2009/0224229 A1 Sep. 10, 2009

(51) Int. Cl.
*H01L 31/00* (2006.01)
(52) U.S. Cl. .................. 257/28; 257/E29.072; 438/478
(58) Field of Classification Search .................... 257/28, 257/E29.072; 438/478
See application file for complete search history.

(56) References Cited

U.S. PATENT DOCUMENTS 5,793,787 A * 8/1998 Meyer et al. ............. 372/45.01
2002/0070390 A1* 6/2002 Chow ........................ 257/197

OTHER PUBLICATIONS

Rita Magri, "Effect of interfacial atomic segregation and intermixing on the electronic properties of InAs/GaSb superlattices", Physical Review B. vol. 65, 165302, published Mar. 22, 2002.*
Nguyen et al., *Very High Quantum Efficiency in Type-11 INAS/GASB Superlattice Photodiode with Cutoff of 12 UM*, Applied Physics Letters 90, 231108 (2007).
Geddo et al., *Photoreflectance of GASB/AL GA SB Single Quantum Wells*, Applied Physics Letters, vol. 73, No. 9, Aug. 31, 1998.
A. Hood et al., *High Differential Resistance Type-11INAS/GASB Superlattice Photodiodes for the Long-Wavelength Infrared*, Applied Physics Letters 89. 093506 (2006).

(Continued)

Primary Examiner—Thao X Le
Assistant Examiner—Matthew Gordon
(74) Attorney, Agent, or Firm—Husch Blackwell Sanders LLP Welsh & Katz

(57) ABSTRACT

The subject invention comprises the realization of P-on-N type II InAs/GaSb superlattice photodiodes. A high-quality InAsSb layer lattice-mismatched to GaSb is used as a buffer to prepare the surface of the substrate prior to superlattice growth. The InAsSb layer also serves as an effective n-contact layer. The contact layer has been optimized to improve device performance, most notably performance that is similar to traditional N-on-P structures.

6 Claims, 3 Drawing Sheets

OTHER PUBLICATIONS

*Avalanche Diodes and Circuits for Infrared photon Counting and Timing: Retrospect And prospect . . . and More, IEEE* LEOS Lasers & Electro-Optics Society News, vol. 20, No. 5—Oct. 2006.

Paskov, P.P., *Refractive Indices of INSB, GASB, INASXSB1-X, and IN1-XGAXSB: Effects of Free Carriers*, American Institute of Physics, J. Appl. Phys. 81 (4), Feb. 15, 1997.

Walther et al., *Growth of INAS/GASB Short-Period Superlattices for High-Resolution Mid-Wavelength Infrared Focal Plane Array Detectors*, Journal of Crystal Growth 278, 156 (2005).

Swaminathan et al., *Infrared Detectors and Lasers Operating in the 3-12 UM, Range Using Band-GAP Engineered Structures with Typle II Band-GAP Alignment*, Proc. of SPIE vol. 6127 61270R-1 (2006).

Delaunay et al., *320X256 Infrared Focal Plane Array Based on Type II INAS/GASB Superlattice with A 12 UM Cutoff Wavelength*, Proc. of SPIE vol. 6542 654204-1 (2007).

Wei et al., *Type II Superlattice Photodetectors for MWIR to VLWIR Focal Place Arrays*, Proc. of SPIE vol. 6206 62060N-1 (2006).

* cited by examiner

POLARITY INVERSION OF TYPE-II INAS/GASB SUPERLATTICE PHOTODIODES

BACKGROUND OF THE INVENTION

This application relates to the realization of P-on-N type II InAs/GaSb superlattice photodiodes, and more particularly, to polarity inversion of type II InAs/GaSb superlattice photodiodes. The present application also relates to the realization of P-on-N Type II superlattice photodiodes with a cut-off wavelength of 11 μm and the optimization of contact layers to improve the device performance.

In recent years, Type II superlattice (SL) photodiodes have experienced significant improvements in theoretical design and experimental growth. Focal Plane Array (FPA) imaging in both Mid-wavelength Infrared and Long wavelength Infrared has also experienced improvement. However, one difficulty in the fabrication of Type II superlattice FPAs is the polarity matching with the Read Out Integrated Circuit (ROIC). While most commercially available ROICs formatted for this material system are designed for P-on-N photodiodes, most Type II FPAs reported in the literature are based on an N-on-P design. This opposite polarity forces the ROIC to operate in forward bias and reduces its readability.

Most superlattice photon detectors are grown by state-of-the-art MOCVD and MBE techniques which allow a high material uniformity across a larger wafer. Higher material uniformity translates to FPAs with a higher detector array uniformity, which is very important for lower NEAT (noise equivalent temperature difference). Due to its internal detection mechanism (absorption of photons by electrons), a quantum well photon detector has very fast response time (up to 30 GHz) compared to thermal and other infrared detectors. Fast response time FPAs are highly favored by military applications such as target tracking. With quantum well structure engineering, one may tune the detection wavelength of quantum well photon detectors and, by stacking quantum well structures, one may achieve multi-band detection.

Type-II superlattice detectors (i.e. quantum well photon detectors with type-II band alignment) have shown high room temperature detectivity and such quantum well detectors can be used to build future uncooled FPAs with fast response times. So far, most uncooled FPAs are based on slow thermal detectors, such as microbolometers.

Each multi quantum well (MQW) structure has multiple quantum wells which are artificially fabricated by alternatively placing thin layers of two different, high-bandgap semiconductor materials adjacent to one another to form a stack, as known in the art. The bandgap discontinuity of the two materials creates quantized subbands in the potential wells associated with conduction bands or valence bands.

The band alignment of any heterojunction can be categorized as type-I, type-II staggered or type-II misaligned. In type-I heterojunctions, one material has lower energy for electrons and the holes and therefore both carriers are confined in that layer. In type-II heterojunctions, however, the electrons are confined in one material and the holes in the other. In the extreme case, which is called type-II misaligned, the energy of the conduction band of one material is less than the valence band of the other one.

Type-II superlattice detectors are based on interband optical transitions and hence they can operate at much higher temperatures. Moreover, theoretical calculations and experimental results show that $InAs/Ga_{1-x}In_xSb$ type-II superlattices have a similar absorption coefficient to HgCdTe, and therefore type-II superlattice detectors with high quantum efficiencies are possible.

The special band alignment of the type-II heterojunctions provides three important features that may be used in many devices to improve the overall performance of the device.

The first feature is that a superlattice with the type-II band structure can have a lower effective bandgap than the bandgap of each layer. This is an important issue for the applications in the mid and long infrared wavelength range, since one can generate an artificial material (the superlattice) with a constant lattice parameter but different bandgaps. Very successful detectors and lasers have been implemented in the 2-15 μm wavelength range and InAs/GaInSb superlattices lattice-matched to GaSb substrates.

The second feature is the spatial separation of the electrons and holes in a type-II heterojunction. This phenomenon is a unique feature of this band alignment and is due to the separation of the electron and hole potential wells. As a result of such spatial separation, a huge internal electrical field exists in the junction without any doping or hydrostaticpressure. High performance optical modulators have been implemented based on this feature.

The third feature is the zener-type tunneling in a type-II misaligned heterojunction. Electrons can easily tunnel from the conduction band of one layer to the valence band of the other layer, since the energy of the conduction band of the former layer is less than the energy of the valence band of the later layer. Unlike a zener tunneling junction which requires heavily doped layers, no doping is necessary for such a junction. Therefore, even a semimetal layer can be implemented with very high electron and hole mobilities since the impurity and ion scattering are very low. This feature of type-II heterojunctions has been successfully used for resonant tunneling diodes (RTDs) and recently for the implementation of type-II quantum cascade lasers.

SUMMARY OF THE INVENTION

The subject invention comprises a P-on-N type II InAs/GaSb superlattice photodiode and method for making. More particularly, materials can be grown on GaSb substrates with a Gen II Molecular Beam Epitaxy equipped with As, Sb valved crackers; In, Ga SUMO cells and Si, Be dopant sources. The lack of an n-type dopant, such as Te, for the GaSb layer is a considerable challenge for the realization of P-on-N superlattice photodiodes.

Prior to superlattice growth, the GaSb substrate is prepared by developing a thin GaSb buffer layer. For traditional N-on-P superlattice structures, this buffer layer is p+ doped with Be and acts as a perfect p-type contact. But, for P-on-N structures, growing a P-on-N superlattice directly on a GaSb buffer is not a practical solution. In such a structure, the n-region must be very thick to avoid the effect of the band bending at the GaSb/n-region interface. Another difficulty is that there is no etch-stop indication to terminate the mesa definition step in the processing.

To overcome these problems, a growth technique is described herein using a III-V ternary compound, which is lattice matched with GaSb and can be doped n-type for the bottom contact. A common compound that can be tuned to lattice match with GaSb is the ternary InAsSb. The ternary InAsSb layer is preferred due to its ability to be doped n-type via Silicon and that the conduction band aligns with that of the SLs, efficiently sweeping photo-generated electrons to the n-electrode.

CONCISE DESCRIPTION OF THE DRAWINGS

DETAILED DESCRIPTION OF THE PREFERRED EMBODIMENT

Figure 1A:
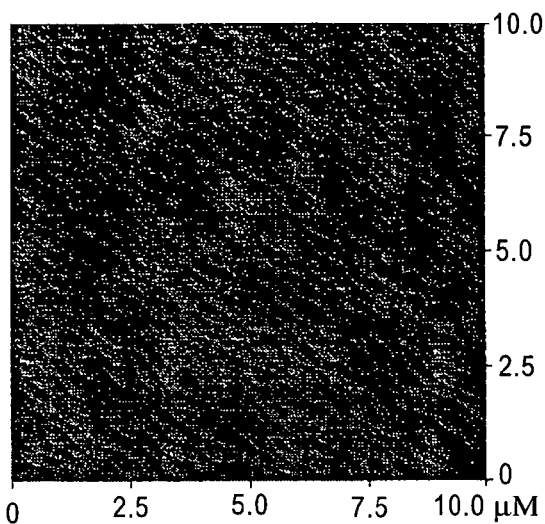
FIG. 1(a) depicts the structural characterization of the InAsSb layer, including the AFM surface with RMS roughness of 1.3 Å.

The active layers of photovoltaic and photoconductive type-II detectors of the subject invention are made from superlattices with a type-II band alignment which in turn can be formed of binary or ternary alloy systems, as known in the art. Similar to a type-I superlattice, the allowed energy states form the 'minibands', due to the coupling of electrons and holes in adjacent wells. However, unlike type-I superlattices, one can adjust the bandgap of type-II superlattices from a finite value to virtually zero. These superlattices resemble a direct gap semiconductor, since the minimum of the miniband in momentum space is located at the center of the Brilloin zone. Knowing the band structure and the optical absorption process in type-II superlattices, one can use conventional photovoltaic and photoconductive structures to realize high performance type-II detectors.

Type-II photoconductive devices may be grown on GaAs substrate or on InSb, InAs, Si, InP, sapphire or other materials in the $\lambda c=12$ µm to $\lambda c=32$ µm range operating at 80 K. Unlike HgCdTe, these detectors showed an excellent energy gap uniformity over a three-inch wafer area which is important for imaging applications. A series of high performance photovoltaic type-II superlattice detectors show excellent uniformity in the VLWIR range. The main advantage of photovoltaic detectors is their suitability for staring, two-dimensional focal plane array (FPA) applications, where low current bias circuitry significantly reduces the array power and heat dissipation requirements.

The reactor and associated gas-distribution scheme used herein are substantially as described in U.S. Pat. No. 5,384,151. The system comprises a cooled quartz reaction tube pumped by a high-capacity roughing pump (120 hr-1) to a vacuum between 7 and 760 Torr. The substrate was mounted on a pyrolytically coated graphite susceptor that was heated by rf induction. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes. Flow rates were controlled by mass flow control.

The reactor was purged with a hydrogen flow of 4 liters/min, and the working pressure of 10-100 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure.

The gas sources used in this study for the growth of GaInAs and GaInP by LP-MOCVD are listed below.

| Group-III Sources | Group-V Source |
| --- | --- |
| $In(CH_3)_3$ | t-butylamine |
| $In(C_2H_5)_3$ | $NH_3$ |
| $(CH_3)_2In(C_2H_5)$ | $As(CH_3)_3$ |
| $(CH_3)_2In(C_2H_5)$ | $As(C_2H_5)_3$ |
| $Ga(CH_3)_3$ | $AsH_3$ |
| $Ga(C_2H_3)_3$ | $PH_3$ |

An accurately metered flow of purified $H_2$ for TMIn and TEGa is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Pure Arsine ($AsH_3$) and Phosphine ($PH_3$) are used as a source of As and P. The metal alkyl or hydride flow can be either injected into the reactor or into the waste line by using two-way valves. In each case, the source flow is first switched into the waste line to establish the flow rate and then switched into the reactor. The total gas flow rate is about 8 liters/min during growth. Stable flows are achieved by the use of mass flow controllers.

The substrate can be GaSb, GaAs, Si, $Al_2O_3$, MgO, SiC, ZnO, $LiGaO_2$, $LiAlO_2$, Cd Te, SiC, InAs, InP, Ga, Sb, InSb, $MgAl_2O_4$ or GaN. Preferably, GaSb is used as the substrate. The epitaxial layer quality is sensitive to the pretreatment of the substrate and the alloy composition. Pretreatment of the substrates prior to epitaxial growth was thus found to be beneficial. One such pretreatment procedure is as follows:

1. Dipping in $H_2SO_4$ for 3 minutes with ultrasonic agitation;
2. Rinsing in Deionized $H_2O$;
3. Rinsing in hot methanol;
4. Dipping in 3% Br in methanol at room temperature for 3 minutes (ultrasonic bath);
5. Rinsing in hot methanol;
6. Dipping in $H_2SO_4$ for 3 minutes;
7. Rinsing in deionized $H_2O$, and
8. Rinsing in hot methanol.

After this treatment, it is possible to preserve the substrate for one or two weeks without repeating this treatment prior to growth.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species, but is relatively independent of temperature between 700° and 1000° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

High quality III-IV materials may be grown in the method of the subject invention by low pressure metalorganic chemical vapor deposition (LP-MOCVD). Other forms of deposition of III-IV films such as in the subject invention, may be used as well including MBE (molecular beam epitaxy), MOMBE (metalorganic molecular beam epitaxy), LPE (liquid phase epitaxy and VPE (vapor phase epitaxy).

The layers of the heterostructure are grown by an induction-heated horizontal cool wall reactor. Trimethylindium (TMI), Triethylgallium (TEG) and Trimethyl Arsenic (TMAs) are typically used as the sources of Indium, Gallium, and Arsenic, respectively. Trimethyl Aluminum (TMAI) and Trimethyl Antimony (TmSb) are used as sources of Aluminum and Antimony, respectively. Sample is typically grown on a sapphire substrate. A barrier layer of AlInSb or GaInSb is individually laid on the substrate at thicknesses from 50 Å to a few 1 μm. The doped active layer may be InAsSb doped with an n-type dopant, such as $SiH_4$. The confinement of the active layer for the subject invention should be as a heterostructure.

Doping is preferably conducted with bis-cyclopentadienyl magnesium ($CP_2Mg$) for p-type doping and silane ($SiH_4$) for n-type doping. Doping is performed through a $BCP_2Mg$ bubbler with $H_2$ as carrier gas and at temperatures from −15° C. to ambient temperatures at 20-1500 $cm^3$/min and onto either a hot or cooled substrate. Dilute $SiH_4$ may be simply directed at ambient temperatures onto the hot, substrate at 20-90 $cm^3$/min.

Dopants usable in the method of the subject invention are as follows:

| n dopant | p dopant |
|---|---|
| $H_2Se$ | $(CH_3)_2Zn$ |
| $H_2S$ | $(C_2H_5)_2Zn$ |
| $(CH_3)_3Sn$ | $(C_2H_5)_2Be$ |
| $(C_2H_5)_3Sn$ | $(CH_3)_2Cd$ |
| $SiH_4$ | $(\eta C_2H_5)_2Mg$ |
| $Si_2H_6$ | $Cp_2Mg$ |
| $GeH_4$ | |

In a preferred doping method for incorporating the maximum amount of p-type dopant on the layer, once the p-type layer to be doped is fully grown, the heat source is terminated and the substrate allowed to cool; the metal and hydride sources are terminated; the dopant flow, for instance DEMg, is initiated at the temperatures indicated for diffusion onto the cooled substrate/epilayer which has been previously grown. After about 2-3 minutes, the dopant flow is terminated and the next epilayer grown. By this method, it is found that $10^{20}$ atoms/$cm^3$ of Mg may be placed on the top surface of the epilayer.

Figure 1B:
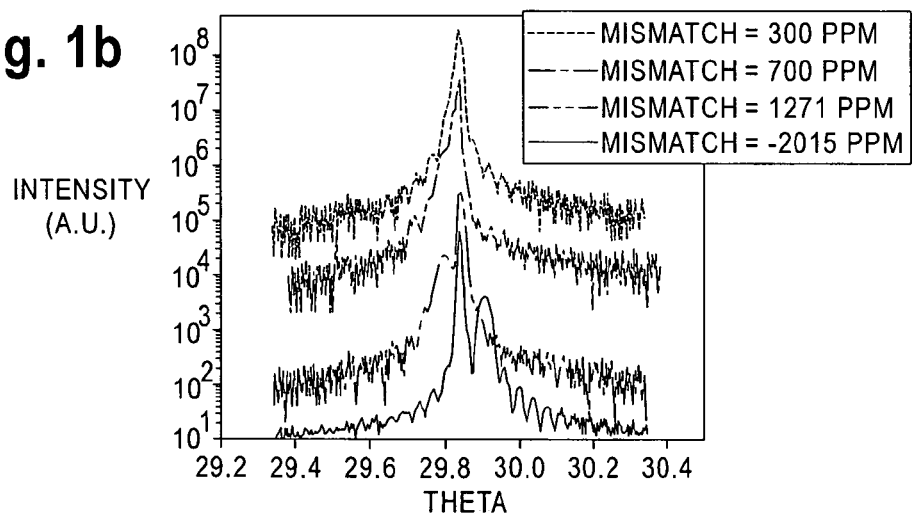
FIG. 1(b) is a high resolution x-ray diffraction showing lattice mismatch of different InAsSb structures relative to the GaSb substrate.

P-on-N type II InAs/GaSb superlattice photodiodes can be grown on GaSb substrates with a Gen II Molecular Beam Epitaxy equipped with As, Sb valved crackers; In, Ga SUMO cells and Si, Be dopant sources. InAsSb growth is conducted immediately after the GaSb buffer growth at the same temperature (~500° C. according to a calibrated pyrometer) with the growth rate of 0.5 Monolayer/s. The As/Sb flux ratio is adjusted until ex-situ X-ray diffraction pattern showed nearly zero lattice mismatch between InAsSb and GaSb substrate. FIG. 1 shows structural characterizations of InAsSb layer growths. The lattice match to GaSb substrate below 300 ppm, corresponding to the compound $InAs_{0.91}Sb_{0.09}$, is achieved with the As:Sb flux ratio of 19:1. This large ratio requires a very strict control of growth temperature and of Sb flux stability in order to have reproducible high quality material. Atomic Force Microscopy (AFM) routinely exhibits uniform atomic steps with RMS roughness less than 1.5 Å at 20×20 μm scan.

In one embodiment of the invention, once the growth condition for lattice matched InAsSb is achieved, the growth of P-on-N superlattice diode can be realized on GaSb residually p-doped wafers. The growth begins with a 200 nm thick un-doped GaSb buffer, followed by a 1 μm thick n-doped (n~$10^{18}$ $cm^{-3}$) InAsSb n-contact in the pre-defined condition. The substrate is then cooled down to around 400° C. for superlattice growth. The superlattice design is chosen to have a cut-off wavelength around 11 μm with the superlattice structure consisting of 12 Monolayers (MLs) of InAs and 7 MLs of GaSb with forced pure InSb interfaces. A 2.8 μm thick superlattice is then deposited with the following doping sequence: 0.45 μm thick n-doped region (n~$5\times10^{18}$ $cm^{-3}$), 1.9 μm thick slightly p-doped (n~$5\times10^{15}$ $cm^{-3}$) active region, and 0.45 μm thick p-doped region (p~$10^{18}$ $cm^{-3}$). To mimic the structure of un-flipped N-on-P diode, a 700 nm p-doped (p~$10^{18}$ $cm^{-3}$) GaSb layer is capped on the top of the superlattice structure for the p-side contact. This layer is aimed to build a barrier blocking any possible breakdown tunneling from the n-electrode to the junction. X-ray and AFM characterizations of the wafer (not shown) exhibit similar structural quality as standard N-on-P superlattice structures, with the surface roughness below 1.5 Å in 20 μm×20 μm scan and high order, narrow diffraction patterns.

To investigate the effect of this barrier's thickness on electrical and optical properties of the device, single element photodiodes with GaSb capping layers of varying thickness were processed and compared. Prior to device processing, the wafer was cleaved into ~2×2 $cm^2$ pieces; the GaSb capping layer of each piece was gradually thinned by a citric acid-based wet etch solution. The GaSb thickness of the samples was: 700 nm, 500 nm, 160 nm, and 0 nm. The final sample was intentionally etched through the GaSb layer and 200 nm into the SLs p-region; it is defined to have a GaSb thickness of −200 nm. Once the GaSb capping layer thickness was determined, photodiode mesas with area varying from $7.85\times10^{-5}$ to $1.26\times10^{-3}$ $cm^2$ were electrically isolated by a combination of $BCl_3$-based dry etching and citric based wet etching, followed by the deposition of Ti/Pt/Au n and p contacts using an electron beam evaporator. Ni/Au metal contacts were deposited on the GaSb capping layer using an electron-beam evaporator. The metal contacts were defined by conventional photolithography and were fabricated using ECR-RF dry etching using $SiCl_4$/Ar chemistry. The metal contacts are defined by a conventional lift-off process known in the art. No passivation was applied, but care was taken to ensure minimal exposure to ambient atmospheric conditions. Photodiodes were then characterized electrically and optically at 77K.

Figure 2:
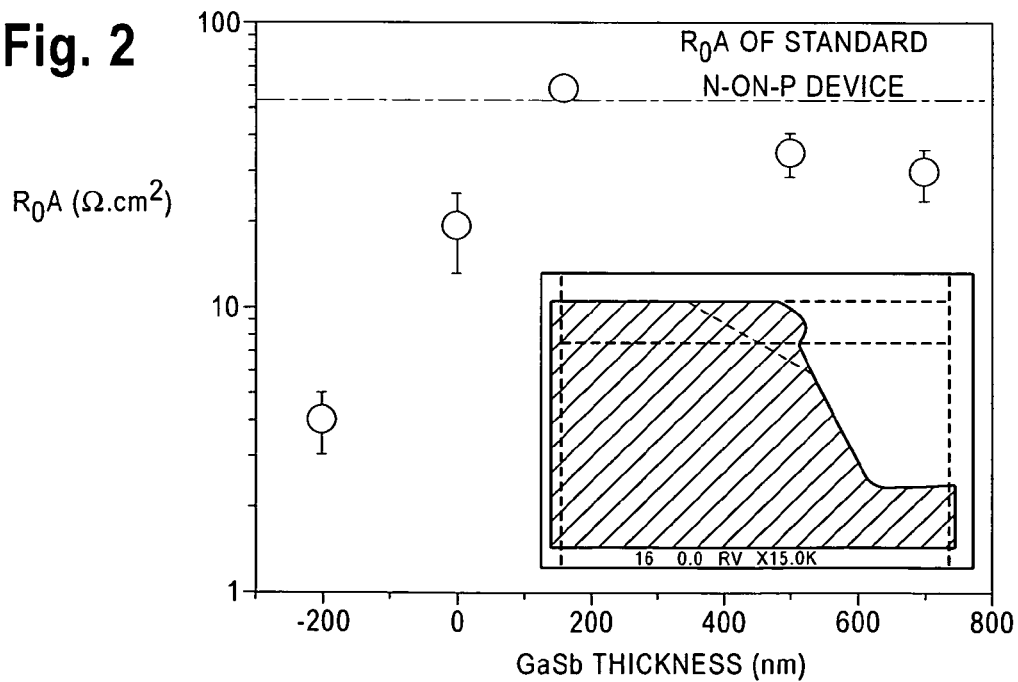
FIG. 2 depicts $R_0A$ versus GaSb capping layer thickness. The inset to FIG. 2 is a scanning electron microscopy image of the device's mesa with GaSb overhang at the sidewall.

FIG. 2 shows the evolution of $R_0A$ product of photodiodes as a function of GaSb capping thickness. As expected, diodes with a thin GaSb barrier, or no barrier at all, had high tunneling current of electrons from the n-electrode to diode's p-region, resulting in a higher dark current and lower $R_0A$. The $R_0A$ value varied exponentially with the GaSb thickness until it reached the maximum value of 58 Ω·$cm^2$, equivalent to the standard $R_0A$ of N-on-P diode with a similar design. When the GaSb layer is thicker than ~200 nm, $R_0A$ showed a slightly decreasing trend, due to the decreased effectiveness of the cleaning step with a thick GaSb capping layer. In the inset of FIG. 2, the selective wet-etch caused an overhang area on the top of mesa sidewalls. When the GaSb capping was too thick, the overhang area was more pronounced and prevented removal of dry-etchant residue on mesa side walls during the cleaning step. This could cause a surface leakage, reducing the $R_0A$ of the devices.

Figure 3:
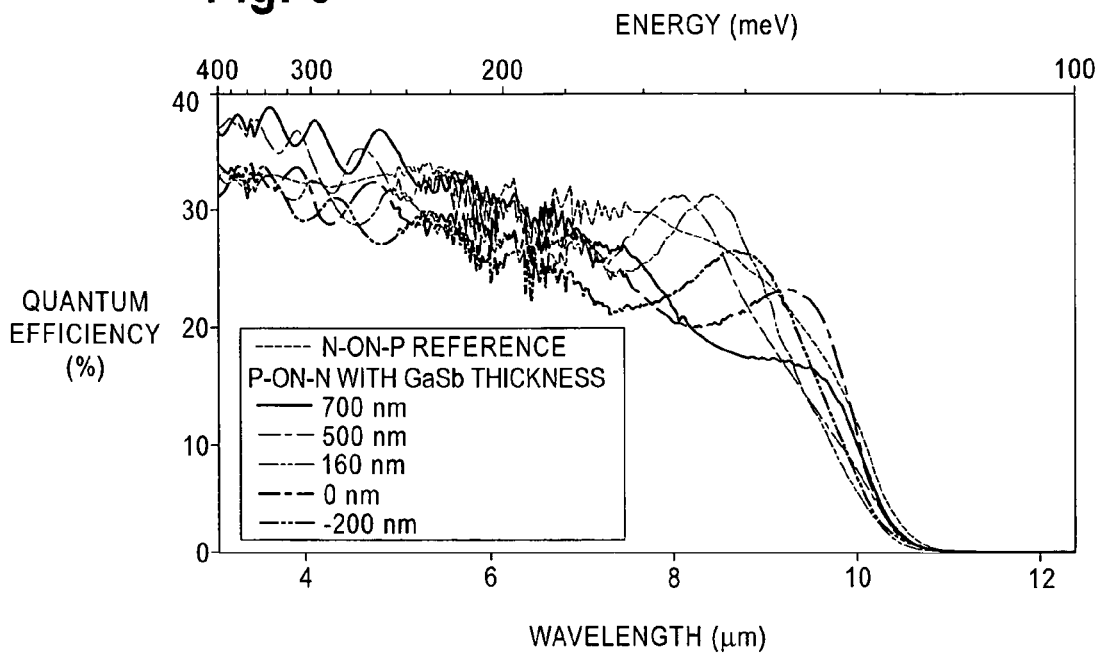
FIG. 3 represents the quantum efficiency of structures with different GaSb capping layer thickness compared to a traditional N-on-P reference structure.

While the GaSb capping layer has great influence on the electrical properties of the devices, the quantum efficiency of all samples are close to that of the standard N-on-P structure (FIG. 3). However, unlike N-on-P devices, the optical spectra of all P-on-N devices have periodic fringes which indicate the presence of a Fabry-Perot cavity in which the maximum (or minimum) field intensity is obtained with wavelengths justifying the relation:

$$2nL + \varphi = m\lambda = m\frac{hc}{E}$$

Where L is cavity length; n: refractive index of the medium; λ: wavelength; h: Plank's constant; c: speed of light; E: photon energy corresponding to the wavelength λ; m: integer for maximum intensity and half integer for minimum intensity; and φ: phase shift due to imperfect reflection at the interfaces.

Figure 4:
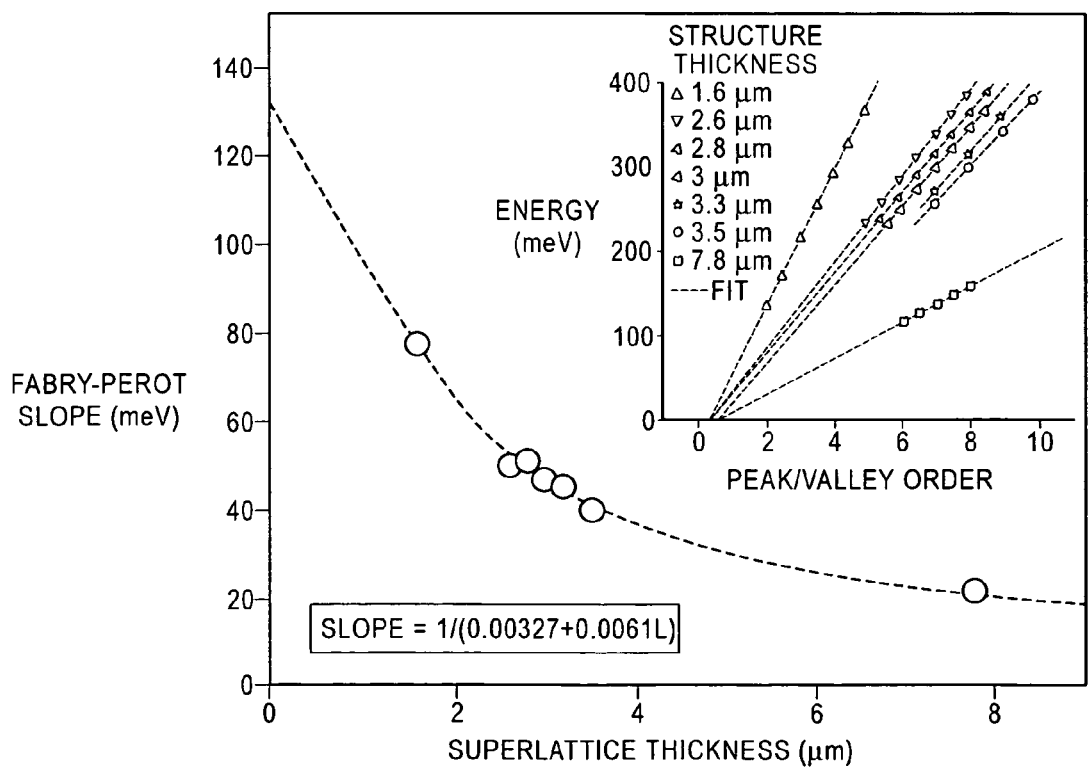
FIG. 4 depicts a Fabry-Perot slope versus device thickness with a linear relationship between peak/valley positions and interference order of studied samples.
Figure 5:
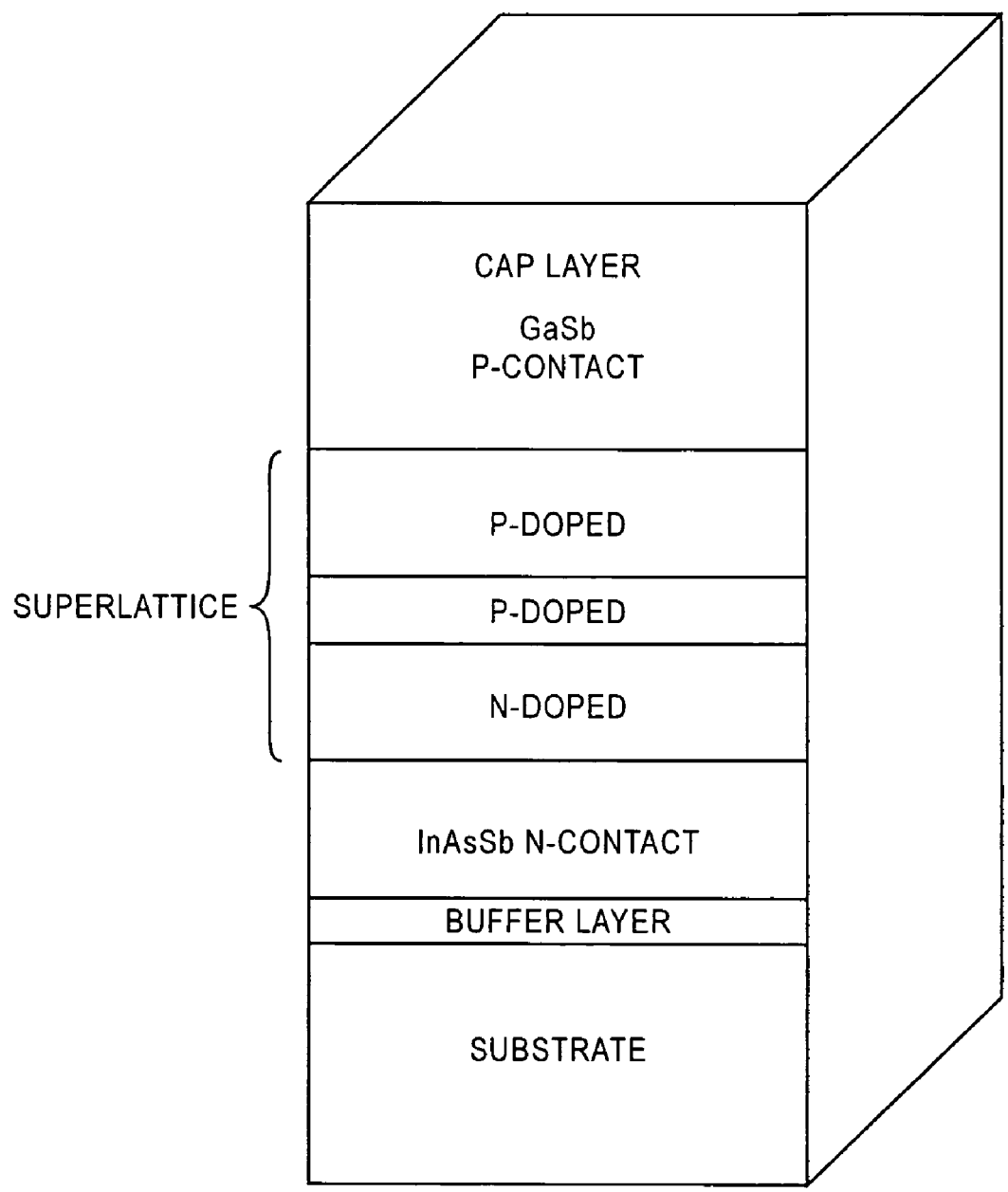
FIG. 5 is a schematic diagram of a semiconductor device of the subject invention.

The fact that oscillatory spectra occur even with the P-on-N structure without a GaSb capping layer means that the Fabry-Perot cavity is actually the superlattice layer with two mirrors at the air/superlattice and InAsSb/superlattice interfaces. For N-on-P structures, the oscillation is not observed because the reflectivity at the GaSb/superlattice interface is too small. The refractive index of the superlattice is expected to be close to $n_{GaSb}$ (~3.8) and different from $n_{InAsSb}$ (close to $n_{InAs}$ ~3.4) in the infrared range. To verify this hypothesis, two new samples were grown with similar structure except for the superlattice thickness being 1.3 μm and 7.5 μm respectively and the thickness of GaSb capping layer being about 250 nm. Oscillation fringes were also observed in the quantum efficiency spectra of these two samples, but with much different periodicity. When photon energy corresponding to spectra's peaks or valleys were plotted in the inset of FIG. 4, all data points line up perfectly as predicted from equation (1). The slopes of the line versus device's thickness were shown in the main plot of FIG. 4 and fitted with a hyperbolic curve:

$$\text{slope} = \frac{hc}{2nL + \varphi}$$

From the fitting curve, we can estimate the value of $n_{SL}$ to be 3.78 which is in agreement with the above analysis.

The present invention discloses the realization of P-on-N type II InAs/GaSb superlattice photodiodes grown on p-type GaSb substrate. Material growth and structural design is optimized to have the similar device performance as traditional N-on-P structures.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

What is claimed is:

1. An infrared detector, comprising:
   a substrate;
   a buffer layer on the substrate;
   an InAsSb n-doped contact layer on the buffer layer substrate;
   a type-II superlattice of 12 monolayers of InAs and 7 monolayers of GaSb having InSb interfaces on the InAsSb n-doped contact, said superlattice comprising a lower n-doped region, an intermediate p-doped region and an upper p-doped region, and a p-doped GaSb contact layer on the superlattice structure.

2. The infrared detector device of claim 1 wherein the substrate is GaSb.

3. The infrared detector device of claim 2 wherein the GaSb substrate is p-type.

4. The infrared detector device of claim 1 wherein the buffer layer is un-doped.

5. The infrared detector device of claim 1 wherein the type-II superlattice consists of a lower 0.45 μm thick n-doped region, an intermediate 1.9 μm thick slightly p-doped region, and an upper 0.48 μm thick p-doped region.

6. The infrared detector device of claim 1 wherein the p-doped GaSb contact layer has a thickness within the range of 100 nm to 250 nm.

* * * * *